(12) United States Patent
Zhang et al.

(10) Patent No.: US 9,768,292 B2
(45) Date of Patent: Sep. 19, 2017

(54) LATERALLY DIFFUSED METAL OXIDE SEMICONDUCTOR DEVICE AND MANUFACTURING METHOD THEREFOR

(71) Applicant: CSMC TECHNOLOGIES FAB1 CO., LTD., Jiangsu (CN)

(72) Inventors: Shu Zhang, Jiangsu (CN); Guangtao Han, Jiangsu (CN); Guipeng Sun, Jiangsu (CN)

(73) Assignee: CSMC TECHNOLOGIES FAB1 CO., LTD., Jiangsu (CN)

( * ) Notice: Subject to any disclaimer, the term of this patent is extended or adjusted under 35 U.S.C. 154(b) by 33 days.

(21) Appl. No.: 14/891,470

(22) PCT Filed: May 16, 2014

(86) PCT No.: PCT/CN2014/077681
§ 371 (c)(1),
(2) Date: Nov. 17, 2015

(87) PCT Pub. No.: WO2014/183669
PCT Pub. Date: Nov. 20, 2014

(65) Prior Publication Data
US 2016/0099347 A1    Apr. 7, 2016

(30) Foreign Application Priority Data

May 16, 2013 (CN) .......................... 2013 1 0186628

(51) Int. Cl.
*H01L 29/66* (2006.01)
*H01L 29/78* (2006.01)
(Continued)

(52) U.S. Cl.
CPC ...... *H01L 29/7816* (2013.01); *H01L 21/0274* (2013.01); *H01L 21/02532* (2013.01);
(Continued)

(58) Field of Classification Search
CPC .............. H01L 29/7816; H01L 21/426; H01L 21/0274; H01L 21/02595; H01L 21/02532; H01L 29/66681
See application file for complete search history.

(56) References Cited

U.S. PATENT DOCUMENTS 9,306,060 B1 * 4/2016 Yang ................... H01L 29/7823
2010/0163991 A1 * 7/2010 Kim ..................... H01L 29/0653
257/343
2012/0228695 A1 9/2012 Toh et al.

FOREIGN PATENT DOCUMENTS

CN         101071824 A      11/2007
CN         101217160 A       7/2008
(Continued)

OTHER PUBLICATIONS

International Search Report, PCT/CN2014/077681.
Office Action dated Jun. 28, 2016 in Chinese Patent Application No. 201310186628.0, pp. 1-5.

*Primary Examiner* — Elias M Ullah
(74) *Attorney, Agent, or Firm* — Polsinelli PC

(57) ABSTRACT

Provided is a manufacturing method for a laterally diffused metal oxide semiconductor device, comprising the following steps: growing an oxide layer on a substrate of a wafer (S210); coating a photoresist on the surface of the wafer (S220); performing photoetching by using a first photoetching mask, and exposing a first implantation window after development (S230); performing ion implantation via the first implantation window to form a drift region in the substrate (S240); coating one layer of photoresist on the surface of the wafer again after removing the photoresist (S250); performing photoetching by using the photoetching mask of the oxide layer of the drift region (S260); and
(Continued)

etching the oxide layer to form the oxide layer of the drift region (S270). Further provided is a laterally diffused metal oxide semiconductor device.

10 Claims, 3 Drawing Sheets

(51) Int. Cl.
*H01L 29/423* (2006.01)
*H01L 21/02* (2006.01)
*H01L 21/027* (2006.01)
*H01L 21/28* (2006.01)
*H01L 21/426* (2006.01)

(52) U.S. Cl.
CPC .. *H01L 21/02595* (2013.01); *H01L 21/28035* (2013.01); *H01L 21/426* (2013.01); *H01L 29/42368* (2013.01); *H01L 29/66659* (2013.01); *H01L 29/66681* (2013.01); *H01L 29/7835* (2013.01)

(56) References Cited

FOREIGN PATENT DOCUMENTS

| | | |
|---|---|---|
| CN | 102088034 A | 6/2011 |
| CN | 102097389 A | 6/2011 |
| CN | 102891180 A | 1/2013 |
| EP | 0676799 A2 | 10/1995 |

\* cited by examiner

LATERALLY DIFFUSED METAL OXIDE SEMICONDUCTOR DEVICE AND MANUFACTURING METHOD THEREFOR

FIELD OF THE INVENTION

The present disclosure relates to manufacturing methods for semiconductor devices, and more particularly relates to a laterally diffused metal oxide semiconductor device and a method of manufacturing the same.

BACKGROUND OF THE INVENTION

With the continuous development of integrated circuits, laterally diffused metal oxide semiconductor (LDMOS) devices are widely used in switching devices of the home appliances, automotive electronics, medical, and military electronics. For this type of LDMOS, the higher breakdown voltage (BV) and the lower Rdson have always been the ultimate goals.

A conventional method for manufacturing a N trench LDMOS includes the following steps:

A pad oxide layer and a pad silicon nitride are firstly grown using a furnace tube, a photoresist is then coated, which is exposed by using a drift region photomask to define a drift pattern. The pad silicon nitride is removed using etching technology under the protection of the photoresist. Ion implantation is performed to the drift region to adjust the ion concentration of the drift region. After the photoresist is removed, an oxide layer with a predetermined thickness is grown in the furnace tube using the pad oxide layer and the pad silicon nitride as the mask, the pad oxide layer and the pad silicon nitride are then removed. After that, implantation concentration adjustment is performed at drift region and drain end using NG photomask, thus forming a concentration transition region.

During the thermal growth of the drift region oxide layer, the impurity ion implanted in the drift region will diffuse outwardly for a distance, as shown in region A of FIG. 1. The concentration of the n-type impurity in this region is relatively low, when the device is turned on, the resistance contributed by this region is high, resulting in a total high Rdson of the device.

SUMMARY OF THE INVENTION

Accordingly, it is necessary to provide a method of manufacturing a laterally diffused metal oxide semiconductor device, so as to resolve the problem of high Rdson of the LDMOS device.

A method of manufacturing a laterally diffused metal oxide semiconductor device includes the following steps: growing an oxide layer on a substrate of a wafer having a first doping type; coating a photoresist on a surface of the wafer; performing lithography by using a first photomask, and exposing a first implantation window after developing; performing ion implantation via the first implantation window, and forming a drift region in the substrate, wherein the ion implantation is performed by implanting impurity ion having a second doping type; coating a photoresist on the surface of the wafer again after removing the photoresist; performing lithography by using a drift region oxide layer photomask; and etching the oxide layer to form a drift region oxide layer, wherein conductivity types of the first doping type and the second doping type are contrary.

In one embodiment, prior to growing the oxide layer on the substrate of the wafer having the first doping type, the method further comprises: forming a well region having the first doping type in the substrate, the drift region is formed in the well region.

In one embodiment, the first doping type is p-type, and the second doping type is n-type.

In one embodiment, after etching the oxide layer to form the drift region oxide layer, the method further comprises: depositing polysilicon and etching the polysilicon to form a gate, a part of the gate covers the drift region oxide layer.

In one embodiment, implantation energy of the ion implantation ranges from 110 keV to 130 keV.

In one embodiment, the performing ion implantation via the first implantation window, and forming the drift region in the substrate comprises: forming the drift region and a drain during one time ion implantation, and implanted doping ion concentrations of the drift region and the drain are the same after the ion implantation is completed.

In one embodiment, after performing ion implantation via the first implantation window, and forming the drift region in the substrate, the method further comprises: performing lithography by using a drain photomask, and performing ion implantation to form a drain in the substrate.

Accordingly, it is also necessary to provide a laterally diffused metal oxide semiconductor device, so as to resolve the problem of high Rdson of the LDMOS device.

A laterally diffused metal oxide semiconductor device includes: a substrate having a first doping type; a well region having the first doping type located in the substrate; a body region having the first doping type located in the well region; a source having the first doping type located in the well region; a drift region having a second doping type located in the well region; a drain having the second doping type located in the well region; a field oxide region located on a surface of the well region and between the body region and the source; a drift region oxide layer located on a surface of the drift region; and a gate located on the well region; wherein a part of the gate covers the drift region oxide layer, the drift region and the drain are integrally formed, doping ion concentrations of the drift region and the drain are the same; conductivity types of the first doping type and the second doping type are contrary.

In one embodiment, the first doping type is p-type, and the second doping type is n-type.

In the forgoing laterally diffused metal oxide semiconductor device and a manufacturing method thereof, the drift region oxide layer is firstly grown, and the drift region ion implantation is then performed, therefore the problem of low ion concentration and high Rdson of the lateral diffusion region caused by thermally growing drift region oxide layer can be avoided. Since high concentration ions are directly implanted into this region, the Rdson is effectively decreased.

DETAILED DESCRIPTION OF THE EMBODIMENTS

Reference will now be made to the drawings to describe, in detail, embodiments of the present invention.

Figure 2:
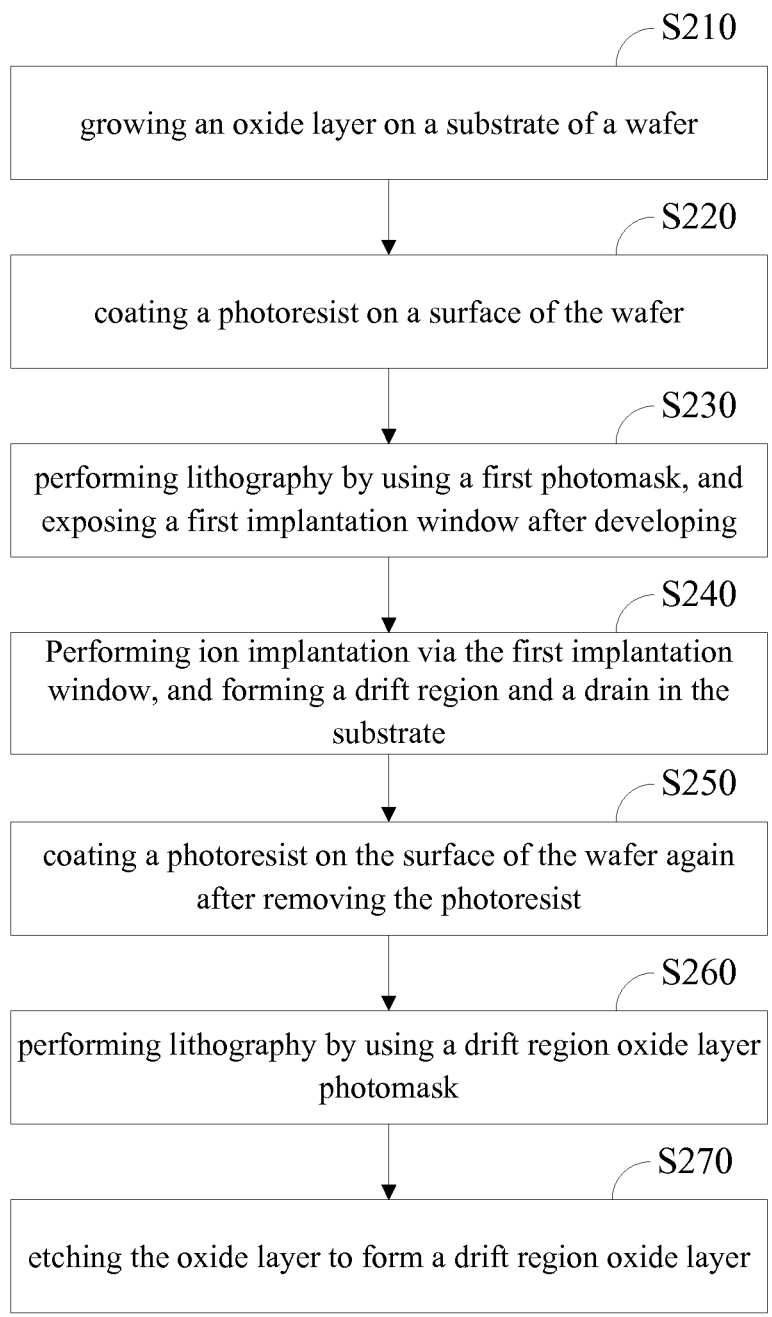
FIG. 2 is a flow chart of a method of manufacturing a laterally diffused metal oxide semiconductor device according to an embodiment.

Referring to FIG. 2, a method of manufacturing a laterally diffused metal oxide semiconductor device includes the following steps:

In step S210, an oxide layer is grown on a substrate of a wafer.

In the present embodiment, the oxide layer having a desired thickness is grown on the substrate having the first doping type by using a furnace tube. Since the oxide layer will be etched to form a drift region oxide layer, the desired thickness is the thickness of the drift region oxide layer. In alternative embodiments, the oxide layer can also be grown by using other methods, such as chemical vapor deposition (CVD) and the like.

Taking N trench LDMOS as an example, the first doping type is p-type, and the second doping type is n-type. It should be understood for the person skilled in the art that, this manufacturing method for the laterally diffused metal oxide semiconductor device can also be applied to P trench LDMOS.

In one embodiment, prior to step S10, the method further includes forming a well region having the first doping type in the substrate.

In step S220, a photoresist is coated on a surface of the wafer.

In step S230, lithography is performed by using a first photomask, and a first implantation window is exposed after developing.

The first photomask is a photomask formed by combining drift region pattern and drain pattern. By exposing and developing using this photomask, the photoresist positioned above the drift region and the drain can be dissolved by developer and exposed to form the first implantation window.

In step S240, ion implantation is performed via the first implantation window, and a drift region and a drain are formed in the substrate.

Figure 1:
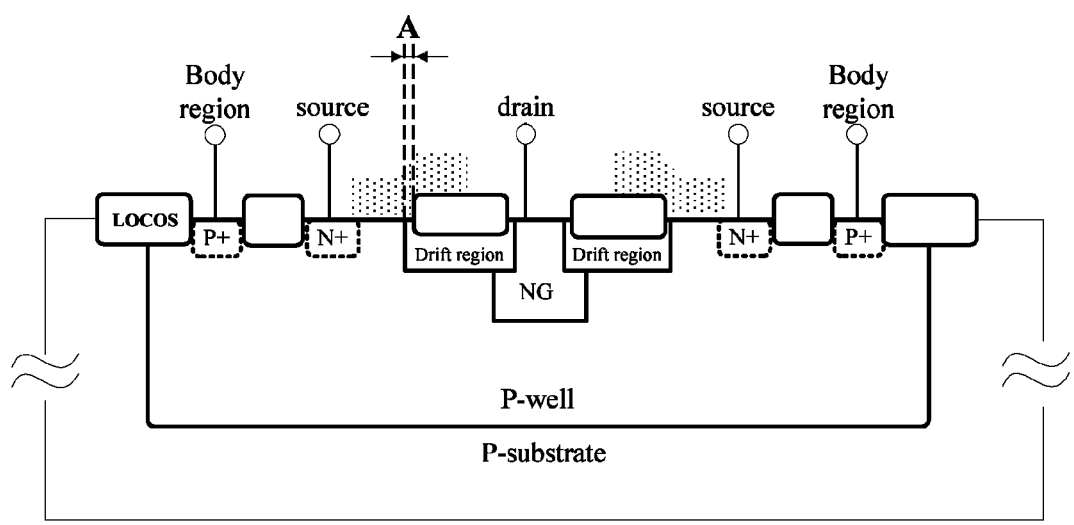
FIG. 1 is a cross-section view of a conventional N-trench LDMOS device during manufacturing.

The impurity ion having the second doping type is implanted. The implanted ions pass through the oxide layer formed in step S210 and form the drift region and the drain in the well region. The implantation region includes region A of FIG. 1. Since the drift region and the drain are simultaneously implanted, concentrations of n-type impurity ion in both drift region and the drain are consistent.

In the present embodiment, implantation energy of the ion implantation ranges from 110 keV to 130 keV.

In the alternative embodiments, lithography for the drain and an adjustment ion implantation can be performed once again after step S240.

In step S250, a photoresist is coated on the surface of the wafer again after the photoresist is removed.

After the photoresist coated in step S220 is removed, a new photoresist is coated again.

In step S260, lithography is performed by using a drift region oxide layer photomask.

After exposing and developing, a portion of the oxide layer formed in the step S210 which needs to be etched away is exposed.

In step S270, the oxide layer is etched to form a drift region oxide layer.

Figure 3:
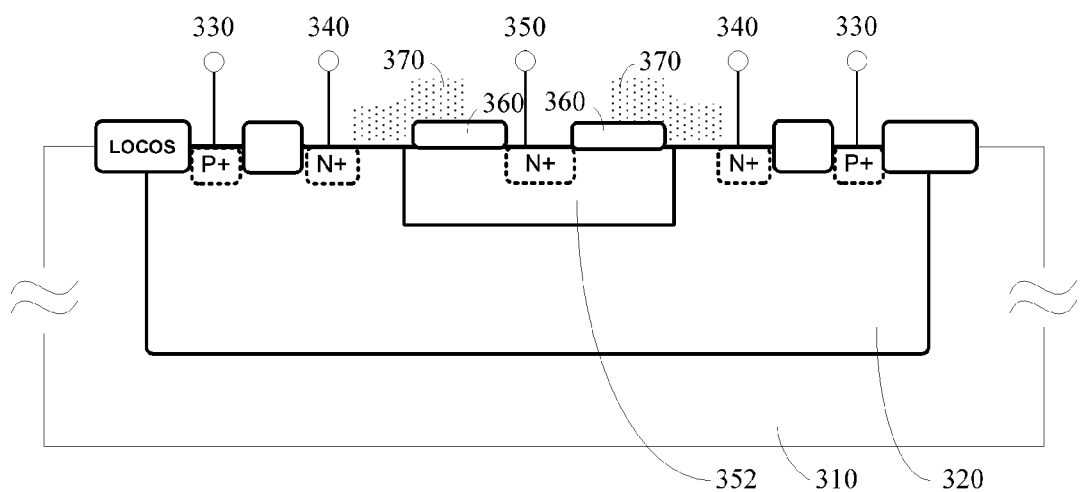
FIG. 3 is a cross-section view of the laterally diffused metal oxide semiconductor device during manufacturing.

An embodiment of a laterally diffused metal oxide semiconductor device is also provided, which can be manufactured according to the forgoing method. FIG. 3 illustrates a cross-section view of the laterally diffused metal oxide semiconductor device in manufacturing. The device in the embodiment is an N trench LDMOS, which includes a p-type substrate 310; a p-type well region 320 located in the substrate 310; a p-type body region 330, a n-type source 340, an n-type drift region 352, and a n-type drain 350, which are located in the well region 320; a field oxide region (not labeled) embedded in a surface of the well region 320 and located between the body region 330 and the source 340 so as to separate them; a drift region oxide layer 360 located on a surface of the drift region 352, and a gate 370 located on the well region 320. The well region 320 is further provided with a Local Oxidation of Silicon (LOCOS) on a surface of a margin thereof, and a part of the gate 370 covers the drift region oxide layer 360. The drift region 352 and the drain 350 are integrally formed. Since the ion implantations of the drift region 352 and the drain 350 are performed in the same procedure, doping ion concentrations of the drift region 352 and the drain 350 are the same.

In the forgoing laterally diffused metal oxide semiconductor device and a manufacturing method thereof, the drift region oxide layer 360 is firstly grown, and the drift region ion implantation is then performed, therefore the lateral diffusion of the ion implantation of the drift region caused by thermally growing drift region oxide layer 352 can be avoided, i.e., the ion concentrations of the left and right ends of the drift region oxide layer 352 are the same as that of the rest part of the drift region oxide layer 352 in FIG. 3, such that the Rdson is decreased. The ion concentration adjustment implantations of the drift region 352 and drain 350 are combined to one time implantation, thus effectively decreasing the drain field, reducing the process complexity and shorting the production cycle. Additionally, a photolithographic mask is saved comparing to the conventional technology, thus the production cost is down. Only one furnace tube is needed to form the drift region 352, comparing to three furnace tubes needed for the conventional mini-LOCOS structure (pad oxide layer-pad silicon nitride-drift region oxide layer), the production cost and cycle are effectively decreased.

The following table shows the comparison of breakdown voltage (BV) and the Rdson of N trench LDMOS structure before the improvement and after the improvement.

| Structure | BV/V | Rdson/mohm * mm² |
|---|---|---|
| before the improvement | 22.9 | 10.11 |
| after the improvement | 22.5 | 7.02 |

Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

What is claimed is:

1. A method of manufacturing a laterally diffused metal oxide semiconductor device, comprising the following steps:
   growing an oxide layer on a substrate of a wafer having a first doping type;
   coating a photoresist on a surface of the wafer;
   performing lithography by using a first photomask, and exposing a first implantation window after developing;
   performing ion implantation via the first implantation window, and forming a drift region in the substrate, wherein the ion implantation is performed by implanting impurity ion having a second doping type;
   coating a photoresist on the surface of the wafer again after removing the photoresist;

performing lithography by using a drift region oxide layer photomask; and etching the oxide layer to form a drift region oxide layer, wherein conductivity types of the first doping type and the second doping type are contrary.

2. The method of manufacturing the laterally diffused metal oxide semiconductor device according to claim 1, wherein prior to growing the oxide layer on the substrate of the wafer having the first doping type, the method further comprises: forming a well region having the first doping type in the substrate, the drift region is formed in the well region.

3. The method of manufacturing the laterally diffused metal oxide semiconductor device according to claim 2, wherein the first doping type is p-type, and the second doping type is n-type.

4. The method of manufacturing the laterally diffused metal oxide semiconductor device according to claim 1, wherein after etching the oxide layer to form the drift region oxide layer, the method further comprises: depositing polysilicon and etching the polysilicon to form a gate, a part of the gate covers the drift region oxide layer.

5. The method of manufacturing the laterally diffused metal oxide semiconductor device according to claim 1, wherein implantation energy of the ion implantation ranges from 110 keV to 130 keV.

6. The method of manufacturing the laterally diffused metal oxide semiconductor device according to claim 1, wherein the performing ion implantation via the first implantation window, and forming the drift region in the substrate comprises: forming the drift region and a drain during one time ion implantation, and implanted doping ion concentrations of the drift region and the drain are the same after the ion implantation is completed.

7. The method of manufacturing the laterally diffused metal oxide semiconductor device according to claim 6, wherein forming the drift region and a drain comprised forming the drain inside the drift region.

8. The method of manufacturing the laterally diffused metal oxide semiconductor device according to claim 1, wherein after performing ion implantation via the first implantation window, and forming the drift region in the substrate, the method further comprises: performing lithography by using a drain photomask, and performing ion implantation to form a drain in the substrate.

9. A laterally diffused metal oxide semiconductor device, comprising:

a substrate having a first doping type;

a well region having the first doping type located in the substrate;

a body region having the first doping type located in the well region;

a source having the first doping type located in the well region;

a drift region having a second doping type located in the well region;

a drain having the second doping type located in the well region;

a field oxide region located on a surface of the well region and between the body region and the source;

a drift region oxide layer located on a surface of the drift region; and a gate located on the well region;

wherein a part of the gate covers the drift region oxide layer, the drift region and the drain are integrally formed, doping ion concentrations of the drift region and the drain are the same;

conductivity types of the first doping type and the second doping type are contrary.

10. The laterally diffused metal oxide semiconductor device according to claim 9, wherein the first doping type is p-type, and the second doping type is n-type.

* * * * *